(12) United States Patent
Rohrbach

(10) Patent No.: US 9,163,775 B2
(45) Date of Patent: *Oct. 20, 2015

(54) MAGNETIC STAND FOR ELECTRONIC DEVICE

(71) Applicant: Apple Inc., Cupertino, CA (US)

(72) Inventor: Matthew D. Rohrbach, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/460,086

(22) Filed: Aug. 14, 2014

(65) Prior Publication Data

US 2014/0361142 A1    Dec. 11, 2014

Related U.S. Application Data

(63) Continuation of application No. 13/223,110, filed on Aug. 31, 2011, now Pat. No. 8,824,166.

(51) Int. Cl.
| | |
|---|---|
| *A47G 29/00* | (2006.01) |
| *F16M 11/04* | (2006.01) |
| *B60R 11/02* | (2006.01) |
| *F16M 11/22* | (2006.01) |
| *F16M 11/24* | (2006.01) |
| *F16M 13/00* | (2006.01) |
| *F16M 13/02* | (2006.01) |
| *H04B 1/3877* | (2015.01) |
| *H01F 7/02* | (2006.01) |
| *G06F 1/16* | (2006.01) |

(Continued)

(52) U.S. Cl.
CPC .......... *F16M 11/041* (2013.01); *B60R 11/0252* (2013.01); *F16M 11/22* (2013.01); *F16M 11/242* (2013.01); *F16M 13/00* (2013.01); *F16M 13/022* (2013.01); *G06F 1/1633* (2013.01); *H01F 7/0252* (2013.01); *H04B 1/3877* (2013.01); *B60R 2011/0028* (2013.01); *H04M 1/04* (2013.01)

(58) Field of Classification Search
CPC ................................ F16B 47/00; A47G 29/00
USPC .......................................................... 248/683
See application file for complete search history.

(56) References Cited

U.S. PATENT DOCUMENTS

| | | |
|---|---|---|
| 8,344,836 B2 | 1/2013 | Lauder et al. |
| 8,390,411 B2 | 3/2013 | Lauder et al. |

(Continued)

FOREIGN PATENT DOCUMENTS

| | | |
|---|---|---|
| CN | 202548700 | 11/2012 |
| EP | 1276090 | 1/2003 |

OTHER PUBLICATIONS

Taiwanese Patent Application No. 101103152—Office Action dated Jun. 4, 2014.

(Continued)

*Primary Examiner* — Forrest M Phillips
(74) *Attorney, Agent, or Firm* — Downey Brand LLP

(57) ABSTRACT

A magnetic stand for a tablet device is disclosed. The magnetic stand is configured to rigidly hold a portion of the tablet device in place and to shield the magnetic field from adversely affecting nearby devices susceptible to strong magnetic fields. The shielding portion of the magnetic stand allows for significant increases in magnetic field strength when compared to similarly configured, unshielded products.

20 Claims, 5 Drawing Sheets

(51) Int. Cl.
*B60R 11/00* (2006.01)
*H04M 1/04* (2006.01)

(56) References Cited

U.S. PATENT DOCUMENTS

| | | | |
|---|---|---|---|
| 8,824,166 B2 * | 9/2014 | Rohrbach | 361/816 |
| 2003/0098857 A1 | 5/2003 | Gettemy et al. | |
| 2004/0044682 A1 | 3/2004 | Nakamura et al. | |
| 2005/0243504 A1 | 11/2005 | Wong et al. | |
| 2006/0007645 A1 | 1/2006 | Chen et al. | |
| 2007/0155446 A1 | 7/2007 | Ho et al. | |
| 2007/0176902 A1 | 8/2007 | Newman et al. | |
| 2009/0091881 A1 | 4/2009 | Lee et al. | |
| 2010/0081377 A1 | 4/2010 | Chatterjee et al. | |
| 2010/0238620 A1 | 9/2010 | Fish | |
| 2012/0194448 A1 | 8/2012 | Rothkopf | |

OTHER PUBLICATIONS

European Patent Application No. 12704478.2—Office Action dated Jun. 12, 2014.
European Patent Application No. 12702354.7—Office Action dated Jun. 18, 2014.
Chinese Application for Invention No. 201210021265.0—Office Action dated Jul. 15, 2014.
PCT Application No. PCT/US2012/023025—International Search Report and Written Opinion dated Dec. 13, 2012.

* cited by examiner

MAGNETIC STAND FOR ELECTRONIC DEVICE

CROSS REFERENCE TO RELATED APPLICATIONS

This application is a continuation of U.S. application Ser. No. 13/223,110, filed Aug. 31, 2011, entitled "MAGNETIC STAND FOR TABLET DEVICE," which is herein incorporated by reference in its entirety.

BACKGROUND

1. Field of the Described Embodiments

The described embodiments relate generally to an apparatus for supporting a tablet device. In particular an apparatus for magnetically attaching a tablet device to a supporting structure is disclosed.

2. Related Art

Tablet devices are used in an increasingly wide range of applications. In many of these applications a way for conveniently mounting the device is required. A number of manufacturers have tried to produce such a device; however since most tablets have no built in mounting mechanism, mounting devices tend to be somewhat cumbersome and generally do not allow for easy removal.

Therefore, what is desired is a way for securely attaching a tablet device to a stand where it can be removed and replaced with ease.

SUMMARY OF THE DESCRIBED EMBODIMENTS

The paper describes many embodiments that relate to an apparatus for magnetically supporting a tablet computer.

A stand for magnetically securing a tablet device is disclosed. The tablet device has a magnetic attachment system disposed within a first portion of a tablet device housing. The stand includes the following components: (1) a cupped portion, and (2) a magnetic attachment mechanism. The cupped portion has an interior with a size and shape arranged to accommodate the first portion of the tablet device by providing a friction force to an exterior surface of the tablet device housing. The magnetic attachment mechanism includes a magnetic element for magnetically interacting with the magnetic attachment system, the magnetic interaction causing the cupped portion to secure the tablet device.

In a particular embodiment, a metallic shunt portion is attached to an exterior surface of the magnetic element for redirecting a portion of a magnetic field emanating from the magnetic element towards the interior of the cupped portion thereby increasing the magnetic interaction. The magnetic shunt portion also secures the magnetic element within the cupped portion.

A magnetic mount for releasably securing a tablet device to a vehicle console is disclosed. The magnetic mount includes the following components: (1) a mounting connector compatible with a vehicle attachment point on the vehicle console; (2) a metallic shunt which positions a plurality of permanent magnets within the magnetic mount, and prevents a magnetic field emanating from the permanent magnets from leaking energy out of the back or sides of the magnetic stand; (3) a specific magnetic signature built into at least one of the plurality of permanent magnets, wherein the tablet device can recognize the magnetic signature as being attached to a vehicle mount; and (4) a cupped portion arranged to provide a friction force for rigidly supporting at least one side of the tablet device, and a structure for shielding the magnetic field emanating from the permanent magnets while the magnetic stand is not in use, where the metallic shunt is mechanically attached to a bottom outer surface of the cupped portion and furthermore where the magnetic field acts to hold a portion of the tablet device securely within the cupped portion.

A detachable motor vehicle communication system is disclosed. The system includes: a tablet device and a stand for detachably securing the tablet device to an interior surface of the motor vehicle. The tablet device includes a display for presenting visual information, a wireless communication interface, and a magnetic attachment mechanism. The stand includes: a magnetic attachment unit that interacts with the tablet's magnetic attachment mechanism to secure the tablet device and the stand. The tablet device also includes a sensor which senses that the tablet device is secured to the stand causing the tablet device to automatically interact with the motor vehicle in a wireless mode.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF EXAMPLE EMBODIMENTS

Representative applications of apparatuses and methods according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Tablet devices are used in an increasingly wide range of applications. In many of these applications a way for conveniently mounting the device is required. A number of manufacturers have produced mechanical devices to accomplish this purpose; however since most tablets have no built in mounting mechanism the mounting device tends to be somewhat cumbersome and not easily removable. For example, in an upscale restaurant that has switched from paper menus and waiters to a tablet based ordering system customers might prefer to remove the tablet device from its stand while they peruse the menu. Forcing the diners to remove the tablet from a complex mechanical contraption will probably detract from the overall experience. It might even contribute to some of the tablet devices being dropped or damaged. Although most tablets do not include external attachment features, the iPad® 2 manufactured by Apple Inc. of Cupertino, Calif. does include magnetic attachment points. The magnetic attachment points have been used nearly exclusively for attaching foldable cover attachments to one side of a tablet device enclosure. Although the foldable cover attachments do conveniently protect the screen from damage, they are not particularly compatible for use as a mounting system. This issue can be overcome by designing a more rigid attachment accessory configured to match up with the magnets built into the tablet device.

Figure 1A:
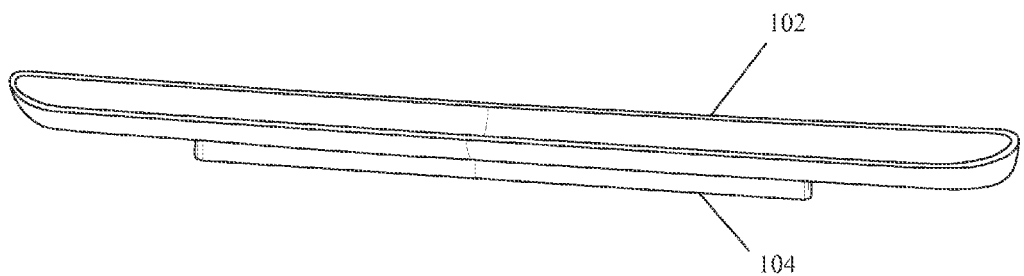
FIG. 1A shows a perspective view of a magnetic stand in accordance with the described embodiments.
Figure 1B:
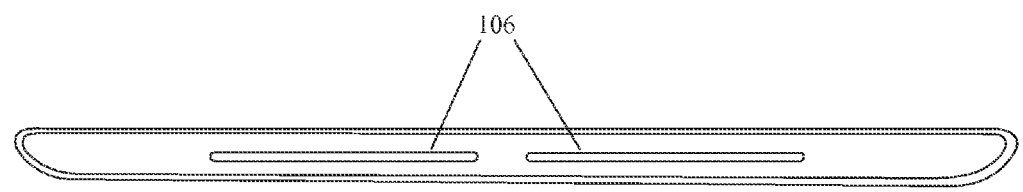
FIG. 1B shows a top view of a magnetic stand in accordance with the described embodiments.

FIGS. 1A and 1B show one such rigid embodiment. FIG. 1A shows a perspective view of one embodiment of a magnetic stand, where a cup portion 102 is configured to slide over a long end of a tablet device and a metallic shunt portion 104 is rigidly attached to the bottom of cup portion 102, which position magnets (not shown) on the bottom side of cup portion 102. Metallic shunt portion 104 also functions to prevent magnetic energy from leaking out of the bottom or sides of the magnetic stand. Cup portion 102 can conform to the long end of the tablet device and creates a rigid structure to hold a tablet device in place. FIG. 1B shows a top view of the embodiment. In FIG. 1B magnetic elements 106 are shown and arranged in a configuration to match up with magnets built into a tablet device. One challenge of providing a strong enough attachment to the tablet is that a stronger field is larger and can have detrimental effects on nearby magnetized objects such as the magnetic stripes on credit cards and bus passes. The described embodiment addresses these challenges in two ways. First the magnets can be rare-earth magnets. Neodymium magnets (the strongest type of rare-earth magnets) in particular can be configured with a large magnetic field, and that field can be channeled into a well defined directional pattern. Additionally the magnetic field strength can be configured to decrease dramatically at the end of the designed field area, vice being allowed to slowly diminish and potentially unpredictably affect items farther away. Second the position of the magnets at the bottom of the cup portion effectively shields the magnetic field from inadvertent interaction with other objects. A further precaution can be taken to avoid effects on neighboring magnetic objects. Spring mounted doors can be installed on the opening to the cup portion to prevent sensitive magnetic objects from inadvertently entering the cup portion and being adversely affected, while still allowing a tablet device to be pushed through and securely seated.

Figure 1C:
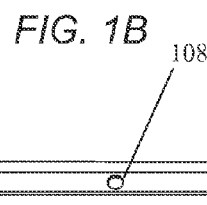
FIG. 1C shows a bottom view of a magnetic stand in accordance with the described embodiments.
Figure 1D:
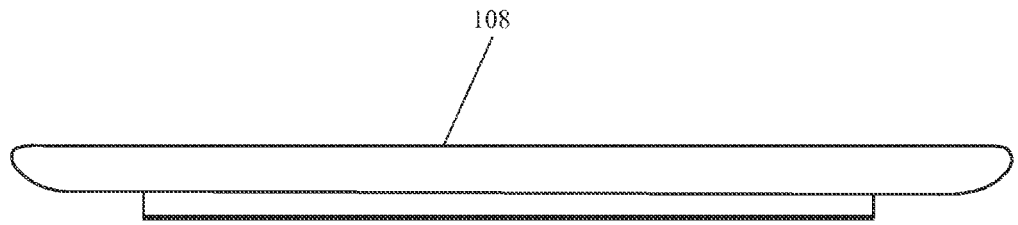
FIG. 1D shows a front view of a magnetic stand in accordance with the described embodiments

FIG. 1C shows a bottom view of the described embodiment. In this view mounting connector 108 is visible. This can be a quarter inch threaded hole as shown in the figure for allowing for easy mounting on existing accessory devices. Mounting connector 108 could also take the form of a clip, clamp, suction cup, or any other means of attachment. Mounting connector 108 allows a tablet device to be placed in a number of orientations and locations, and because of the nature of the magnetic attachment arrangement it can be easily removed and replaced.

Figure 2:
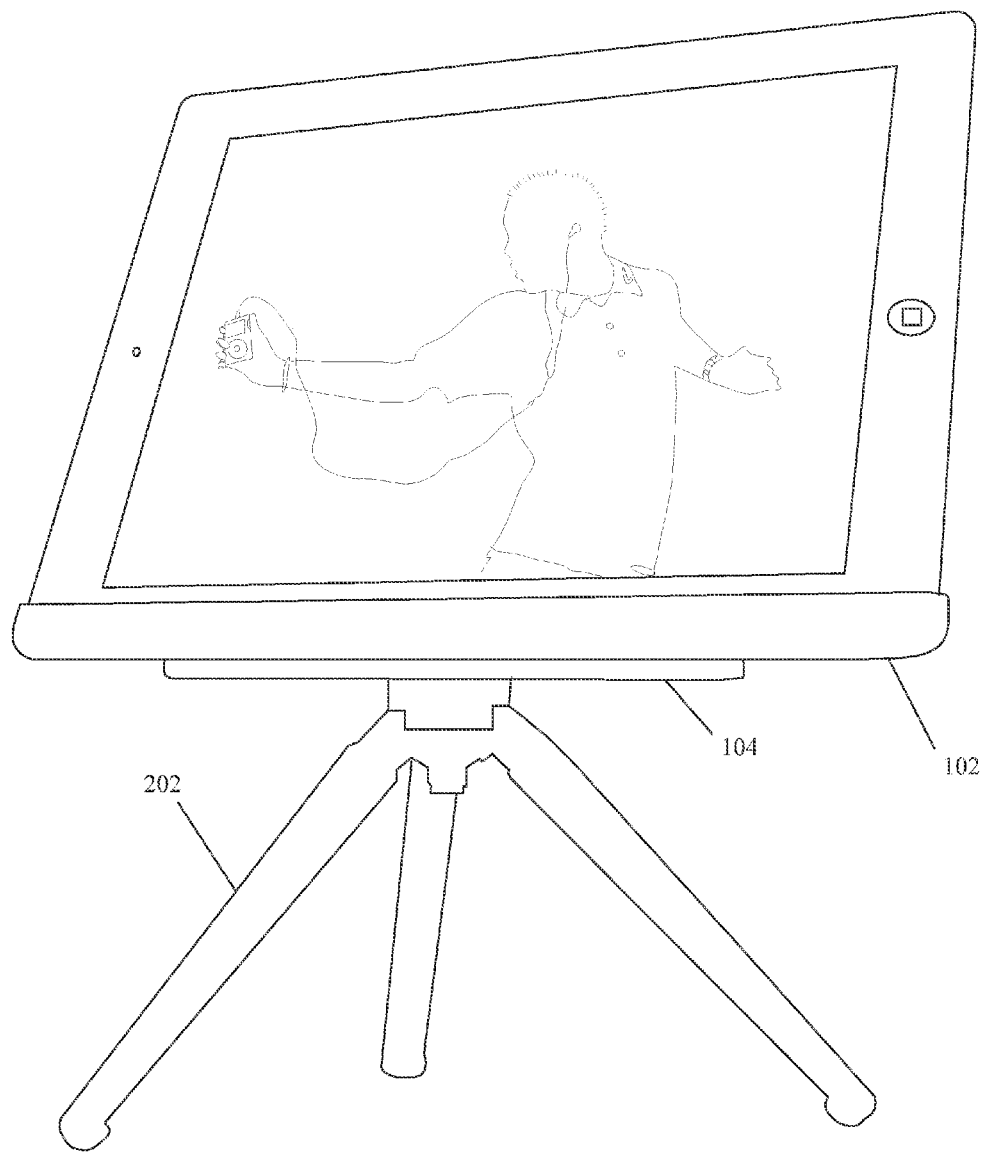
FIG. 2 shows a magnetic stand holding a tablet device mounted on a small tripod in accordance with the described embodiments.

FIG. 2 shows one use of the magnetic stand in accordance with the described embodiments. In this embodiment the magnetic stand is attached to a small tripod 202 via a one quarter inch tripod mount. In this configuration the tablet can be used by a photographer or videographer for reviewing photos or video as they are taken. A wireless transmitter can send data between the camera and the tablet device via a Wi-Fi signal, Bluetooth protocol, or even through an alternative signal received by a wireless receiver attached to the tablet device. In this way a light and portable secondary display can be easily configured for reviewing and displaying products without having to bring along a larger laptop or desktop computer. This configuration can also be useful at a restaurant table allowing specials to be displayed; customers could then touch the displayed special, and then receive more information. If the device were also configured to accept orders the customers might decide to remove the device and enter further details such as table location or payment means into the tablet device.

Figure 3:
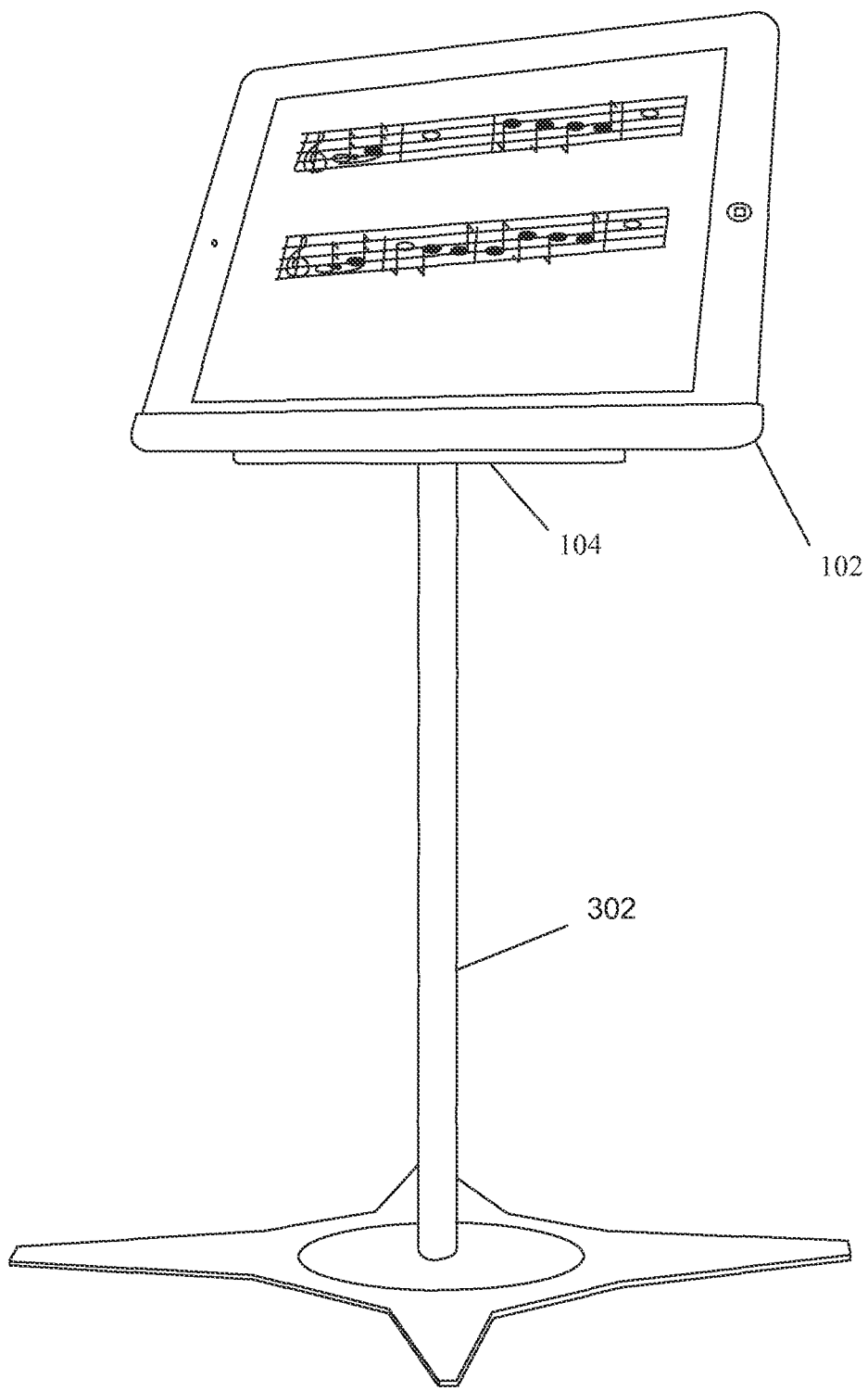
FIG. 3 shows a magnetic stand attached to the top of a music stand in accordance with the described embodiments.

FIG. 3 shows another use of the tablet device holder in accordance with the described embodiments. In this embodiment the tablet holder can be used to support a music stand 302 used to display sheet music on tablet screen. In this way, the strong magnetic connection between the tablet and the tablet holder would allow for a musician to quickly swipe the screen when page turns are required, without having to worry about the possibility of knocking it off its support. A more advanced software configuration can allow the tablet device to turn the pages for the musician at appropriate points in the song. Another software implementation can allow the music to be advanced line by line. In another implementation a conductor can even wirelessly adjust the flow of the music played by a band with another stand mounted tablet, allowing the band to quickly adapt to last minute changes in a musical program.

Figure 4:
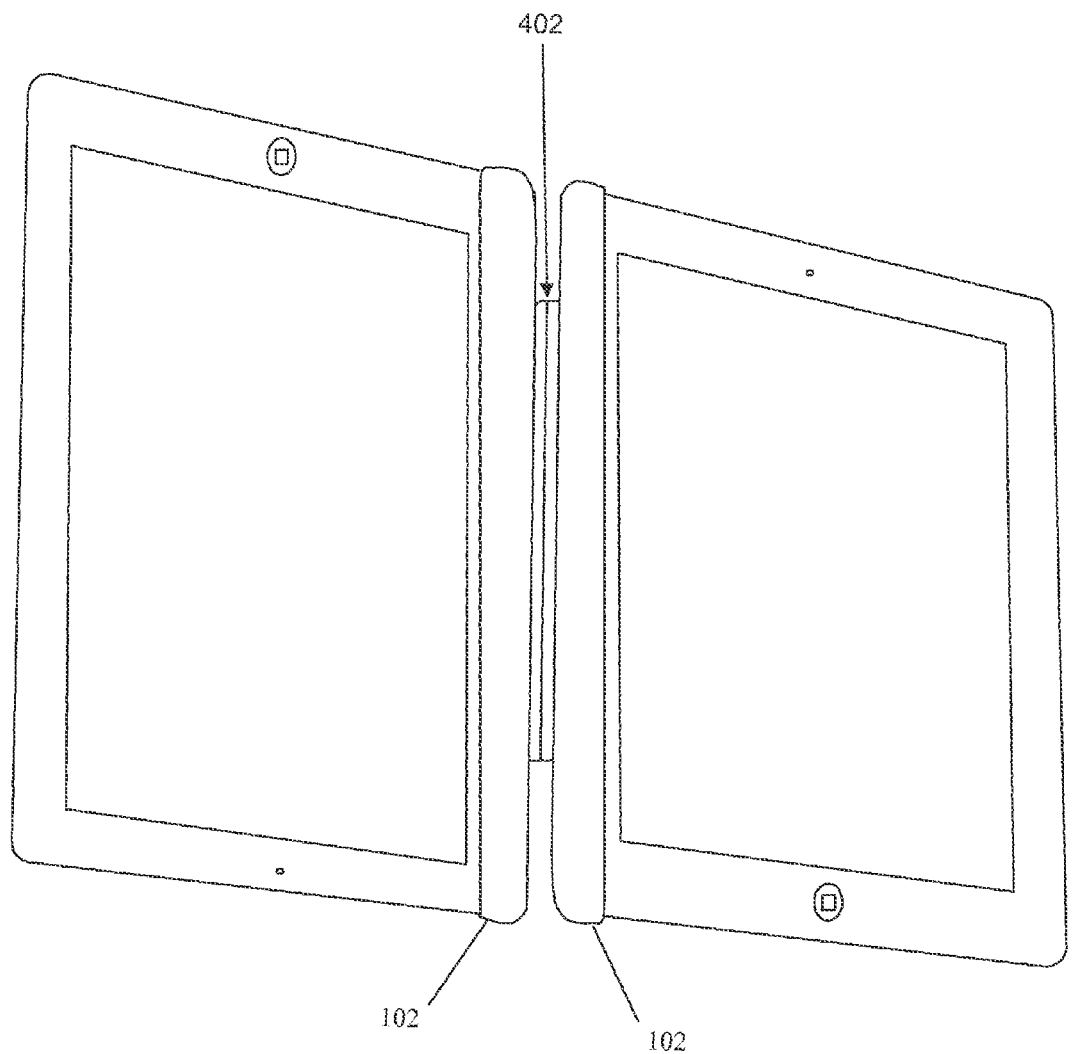
FIG. 4 shows an alternate embodiment of the magnetic stand with two attachment features linked by a hinge for use with two tablet devices.

FIG. 4 shows another embodiment of the tablet holder. In this embodiment the tablet device holder can be configured with two tablet devices secured together by stiff hinge 402. Tablet devices which only contain a strong set of magnets on one side of the enclosure can be inserted into the tablet device holder in alternating directions as shown in the figure to maximize the magnetic attraction forces. In this configuration the tablets can be configured to work together cooperatively. The cooperation can occur over a wireless channel, or the tablet devices can be configured to include a wired connector (not shown) allowing communication to run through a wire that runs between the devices and the connector. Once a communication channel is established the tablet devices can work together to allow activities like book reading or even be configured in more of a laptop arrangement. Without the extra magnetic power enabled by the cup portion of the tablet holder the tablet holder would not be strong enough to maintain a tablet in the orientation normally assumed by a laptop computer screen. In this way the described embodiment allows a user with two tablet devices to configure a virtual keyboard on one tablet device with a working document on the second tablet display.

Figure 5A:
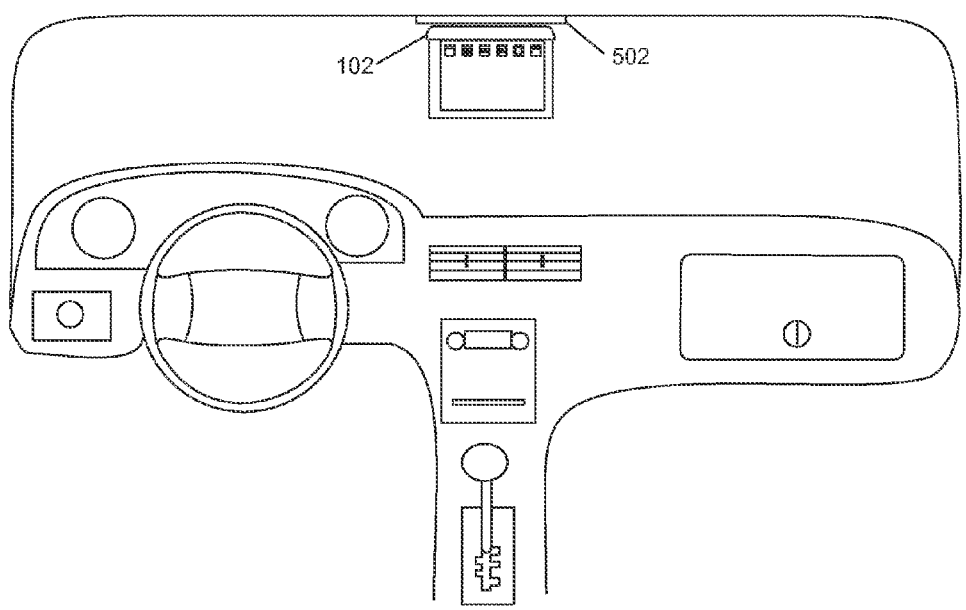
FIG. 5A shows a tablet device attached to the roof of a car with a magnetic stand in accordance with the described embodiments.
Figure 5B:
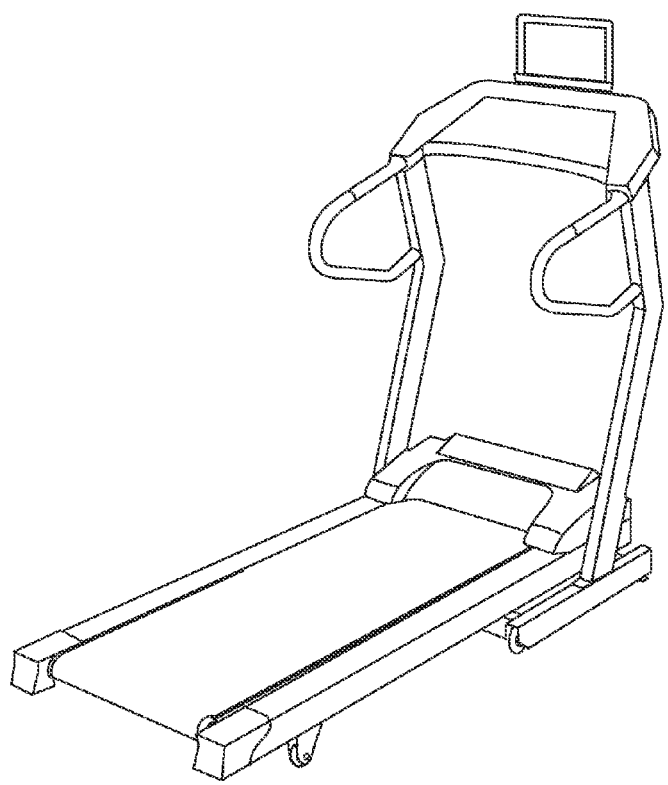
FIG. 5B shows a tablet device attached to a treadmill with a magnetic stand in accordance with the described embodiments.

In other embodiments of the magnetic stand accessory items can be securely attached to a tablet device. This might include devices such as video game controllers, physical keyboards, or even a robust stylus holder. In particular video game controllers need a strong connection to a tablet device to provide a robust control configuration for serious gaming enthusiasts. FIG. 5A shows a magnetic stand supporting a tablet device from above, mounted to vehicle console 502 of an automobile. This makes it easy for a passenger to securely mount the tablet device inside the car and to easily remove it before leaving the vehicle. A vehicle mounted tablet mount can allow a number of additional features to be built into the mount. In this way the tablet could automatically connect to electronic devices built into the car itself. Given prior setup and pairing, Bluetooth and WiFi radio connections could be established moments after the tablet was snapped into place. With these connections activated car manufacturers could allow navigation, backup camera video, music selection, or even vehicle performance data to be displayed in the tablet device. Since a majority of tablet devices include microphones, voice automation can allow drivers to safely interact with the device while driving. A magnetic stand is shown attached with a tablet device in this manner to vehicle console 502 and can be attached via a clutch hinge which would allow the tablet to fold up into vehicle console 502 while not in use. Hall Effect sensors built into the face of the tablet device could sense an additional magnet or magnets built into vehicle console 502 of the vehicle, and the resultant magnetic field can function as a signal to the tablet to automatically secure itself once the tablet is rotated up into the console in close proximity to those magnets, and then to reactivate itself once it is pulled back down, thereby conserving battery life and easing activation. In FIG. 5B a magnetic stand is configured on the front of a treadmill for watching a movie or a television show while jogging or walking. The tablet could also be configured to control various aspects of the treadmill.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A stand for magnetically securing an electronic device, the electronic device having a magnetic attachment system disposed within a first portion of an electronic device housing, the stand comprising:
   a cupped portion, comprising:
      a plurality of integrally formed walls that cooperate to define a cavity having a size and shape arranged to conform around the first portion of the electronic device, wherein mechanical interaction between the integrally formed walls and the electronic device fixes an orientation of the electronic device with respect to the stand when the electronic device is disposed within the cavity and
   a magnetic attachment mechanism, comprising:
      a magnetic element arranged within one of the walls that defines the cavity, the magnetic element emitting a shaped magnetic field that is configured to magnetically interact with the magnetic attachment system and is substantially contained within the cavity, the magnetic interaction causing the first portion of the electronic device housing to be retained within the cavity.

2. The stand as recited in claim 1, further comprising a mounting connector configured to allow the stand to be mounted to another component.

3. The stand as recited in claim 1, wherein the magnetic attachment mechanism further comprises a magnetic shunt that redirects portions of the magnetic field towards the cavity that would otherwise extend outside of the cupped portion.

4. The stand as recited in claim 1, wherein the magnetic interaction between the magnetic element and the magnetic attachment system exceeds the force of gravity.

5. The stand as recited in claim 1, wherein the shaped magnetic field emitted by the magnetic element has a characteristic that is recognizable by a magnetic sensor of the electronic device when the electronic device is coupled with the stand.

6. The stand as recited in claim 1, wherein the stand is integrated with a vehicle communication system comprising a wireless transceiver that is configured to communicate with the electronic device when the electronic device is first connected to the stand.

7. The stand as recited in claim 1, wherein the stand further comprises an additional magnetic element positioned to provide a magnetic field at a magnetic field sensor of the electronic device when the stand is positioned in a particular orientation.

8. The stand as recited in claim 1, wherein the stand comprises a plurality of magnets that cooperate to retain the electronic device within the cupped portion.

9. The stand as recited in claim 1, wherein the magnetic interaction between the magnetic element and electronic device is strong enough to overcome the force of gravity so that an opening of the cupped portion can be oriented directly towards the ground without severing the magnetic coupling.

10. A magnetic stand for supporting an electronic device, the magnetic stand comprising:
   a cupped portion that defines an internal volume having a shape and size that conforms to a first end of an electronic device, the cupped portion comprising a plurality of walls that surround opposing surfaces of the electronic device to prevent rotation of the electronic device within the cupped portion;
   a magnetic assembly, comprising:
      a magnetic element disposed within the cupped portion, the magnetic element emitting a magnetic field that is substantially confined within the internal volume defined by the cupped portion, and
a shunt disposed along an exterior surface of the cupped portion that directs the magnetic field towards the internal volume,
wherein the magnetic element is magnetically coupled with a magnetic attachment system disposed within the electronic device when the first end of the electronic device is disposed within the internal volume defined by the cupped portion.

11. The stand as recited in claim 10, wherein when the first end of the electronic device is disposed within the internal volume, the cupped portion wraps around and covers substantially all of the first end of the electronic device.

12. The stand as recited in claim 11, wherein the shunt is a metallic shunt surrounding a portion of the magnetic element that faces away from the cupped portion.

13. The stand as recited in claim 12, wherein the magnetic element comprises a neodymium magnet.

14. A stand for supporting an electronic device, the stand comprising:
a support member, comprising a bottom wall integrally formed with a plurality of sidewalls that cooperate to define a cavity having a size and shape complementary to an end of an electronic device; and
a magnetic element positioned within the bottom wall and emitting a shaped magnetic field substantially contained within the cavity,
wherein when the end of the electronic device is disposed within the cavity, the electronic device is secured in a fixed orientation with respect to the support member by way of mechanical interaction between the end of the electronic device and the sidewalls of the support member and a magnetic coupling between the magnetic element and a magnetically attractable portion of the electronic device.

15. The stand as recited in claim 14, further comprising:
a magnetic shunt that surrounds an end of the magnetic element facing away from the cavity, the magnetic shunt redirecting portions of the magnetic field towards the cavity that would otherwise extend outside of the support member.

16. The stand as recited in claim 15, wherein the magnetic shunt comprises a mount for coupling the stand to another component.

17. The stand as recited in claim 16, wherein the stand is integrated into a vehicle communication system.

18. The stand as recited in claim 14, wherein the stand is formed from rigid material that maintains a shape of the cavity.

19. The stand as recited in claim 14, wherein the magnetically attractable portion of the electronic device comprises a magnetic attachment system.

20. The stand as recited in claim 14, wherein the end of the electronic device comprises a tapered end.

* * * * *